United States Patent [19]

Hatano

[11] Patent Number: 5,504,355

[45] Date of Patent: Apr. 2, 1996

[54] SOLID STATE IMAGE SENSOR DEVICE HAVING TWO LAYER WIRING STRUCTURE

[75] Inventor: Keisuke Hatano, Tokyo, Japan

[73] Assignee: NEC Corporation, Tokyo, Japan

[21] Appl. No.: 320,831

[22] Filed: Oct. 7, 1994

Related U.S. Application Data

[63] Continuation of Ser. No. 988,331, Dec. 9, 1992, abandoned.

[30] Foreign Application Priority Data

Dec. 10, 1991 [JP] Japan ............................. 3-326054

[51] Int. Cl.$^6$ ..................... H01L 27/148; H01L 23/58
[52] U.S. Cl. ..................... 257/225; 257/232; 257/229; 257/630; 257/435
[58] Field of Search ..................... 257/222, 229, 257/630, 635, 642, 225, 226, 435

[56] References Cited

U.S. PATENT DOCUMENTS

| | | | |
|---|---|---|---|
| 4,717,945 | 1/1988 | Yusa et al. ..................... | 357/24 |
| 4,789,888 | 12/1988 | Miyata et al. ..................... | 357/30 |
| 4,910,568 | 3/1990 | Takei et al. ..................... | 357/24 |
| 4,943,839 | 7/1990 | Kumano et al. ..................... | 357/30 |
| 4,980,735 | 12/1990 | Yamawaki ..................... | 357/24 |
| 5,132,762 | 7/1992 | Yamada ..................... | 357/30 |
| 5,336,919 | 8/1994 | Toriyama ..................... | 257/435 |

*Primary Examiner*—Robert P. Limanek
*Assistant Examiner*—Valencia Martin Wallace
*Attorney, Agent, or Firm*—Burns, Doane, Swecker & Mathis

[57] ABSTRACT

A solid state image sensor device having an effective light detecting element and a peripheral circuit includes a light-shielding film for shielding a periphery of the effective light detecting element, a first wiring film made of the same material as that of the light-shielding film and formed in the same process as that for the light-shielding film, and a second wiring film of aluminum for the peripheral circuit. The first wiring film and the second wiring film form a two layer wiring structure of the peripheral circuit and are electrically interconnected through contact holes in an inter-layer insulating film. With this arrangement, it is possible to lower the wiring resistance for the peripheral circuit and also to cause a signal transfer clock pulse of high-frequency to propagate without its waveform becoming dull.

9 Claims, 4 Drawing Sheets

SOLID STATE IMAGE SENSOR DEVICE HAVING TWO LAYER WIRING STRUCTURE

This application is a continuation of Application No. 07/988,331, filed Dec. 9, 1992, now abandoned.

BACKGROUND OF THE INVENTION

(1) Field of the Invention

The present invention relates to a solid state image sensor device, and more particularly to a wiring structure for a peripheral circuit of the solid state image sensor device.

(2) Description of the Related Art

A wiring film provided for a peripheral circuit of a conventional solid state image sensor is shown in sectional view in FIG. 1. The wiring film of the peripheral circuit is in the form of an aluminum wiring film 6 which is provided on an insulating film 1 on a semiconductor substrate 14.

FIG. 2 shows in sectional view a unit picture element of the conventional solid state image sensor, which is constituted by a photoelectric conversion element 8, a transfer gate 9, a vertical register 10, a channel stopper 11, a vertical transfer electrode 12, and an aluminum light-shielding film 13. The aluminum shielding film 13 is provided on tile vertical transfer electrode 12 since, in an effective light detection region, a light beam incident on the vertical register 10 appears in a reproduced image as a false signal called a smear. Usually, the aluminum shielding film 13 is formed, for simplicity of the fabrication, by use of aluminum (Al) in the same fabrication process step as that for wiring a drive circuit for driving the transfer gate 9, the vertical register 10, and a horizontal register, and for wiring a peripheral circuit such as an output processing circuit for processing an output from a signal electron detection portion of the device.

Where the number of picture elements in the solid state image sensor is increased in order to improve the resolution thereof, the frequency for reading out the signal electrons becomes higher accordingly. In order to cause a signal transfer clock pulse of a high-frequency to propagate in such a way that its waveform does not become dull, it is necessary for the resistance of the wiring for the peripheral circuit go be sufficiently lower. Furthermore, with an increase in the chip size due to the increase in the number of picture elements, the length of the aluminum wiring for the peripheral circuit becomes longer, which leads to an increase in the wiring resistance. In order to lower the wiring resistance of the aluminum wiring of the peripheral circuit, one may attempt either to increase the thickness of the aluminum film or the width thereof. When the thickness of the aluminum film is increased, the thickness of the aluminum shielding film which is formed in the same process will also be increased so that, due to deterioration of processing precision, there arise sensitivity irregularities caused by variations in apertures in various picture elements. So, one may then consider forming, for example, the wiring film for the peripheral circuit and the aluminum shielding film for the unit picture element separately from each other with only the wiring film for the peripheral circuit being made thicker.

For the wiring film of the peripheral circuit and the aluminum shielding film to be formed separately in order to lower the resistance of the aluminum wiring film of the peripheral circuit without increasing the thickness of the aluminum shielding film, the aluminum etching in the form of dry-etching may usually be performed. However, in the case where the aluminum film is thick, it will be necessary to prolong the time for etching (i.e., over-etching) so as not to leave aluminum in place. The over-etching may cause an active region to be damaged and a dark current to be increased.

As to the attempt to lower the resistance of the wiring by increasing the width of the aluminum film, this is not readily made practicable because of the restrictions from chip sizes or wiring layouts.

SUMMARY OF THE INVENTION

An object of the present invention is to overcome the problems existing in the conventional device and to provide an improved solid state image sensor device in which the wiring resistance is effectively lowered.

According to one aspect of the present invention, there is provided a solid state image sensor device having an effective light detecting element and a peripheral circuit, comprising:

- a light-shielding film for shielding a periphery of the effective light detecting element;
- a first wiring film of the same material as that of the light-shielding film; and
- a second wiring film of aluminum forming, together with the first wiring film, a two layer wiring film for the peripheral circuit.

The first wiring film may be made of aluminum and formed in the same process as that for the shielding film, or the first wiring film and the shielding film may be made of a metal selected from refractory metals, such as tungsten (W) with a high melting temperature.

The solid state image sensor device includes an interlayer insulating film and the first wiring film and the second wiring film are in electrical contact with each other through contact holes in the interlayer insulating film.

In a solid state image sensor device according to the present invention, the wiring of a peripheral circuit is constituted by a combination of a first film of aluminum or of a metal selected from refractory metals that shields the effective light detecting element and a second film of aluminum.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, the present invention is explained with reference to the appended drawings. It is to be noted that, throughout the following explanation, similar reference symbols or numerals refer to the same or similar elements in all the figures of the drawings.

Figure 1:
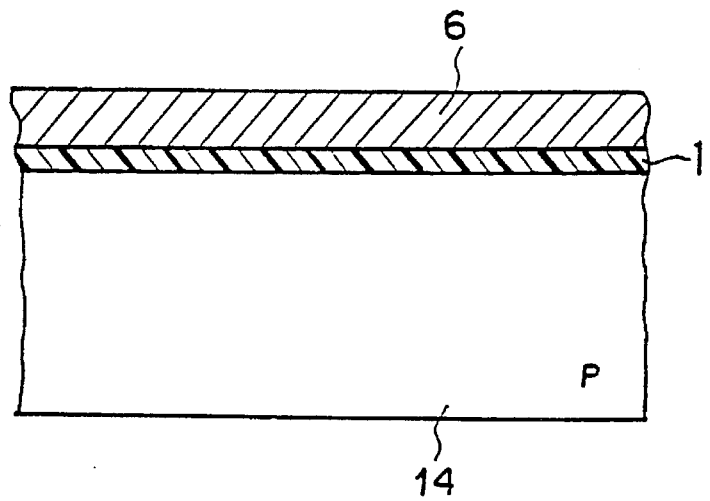
FIG. 1 is a sectional view showing a wiring structure in a conventional solid state image sensor device.
Figure 2:
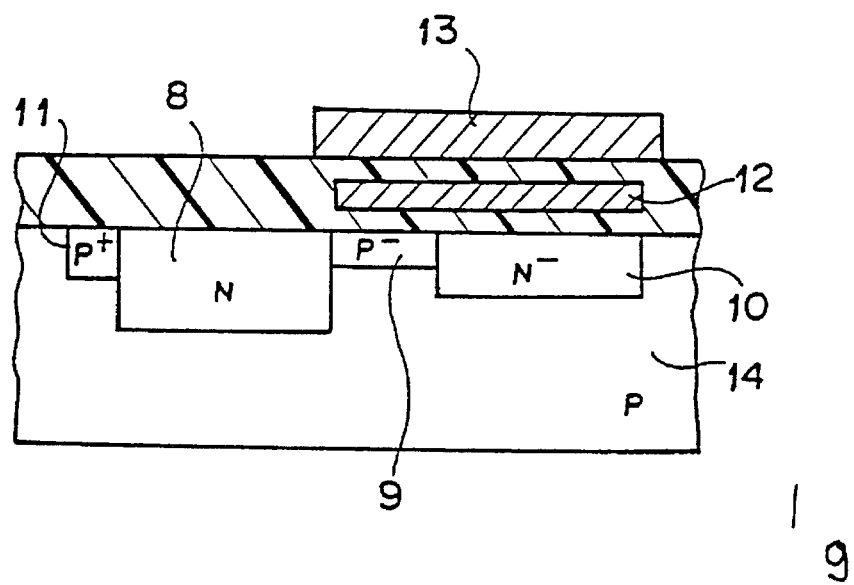
FIG. 2 is a sectional view of a unit picture element in the conventional solid state image sensor device.
Figure 3:
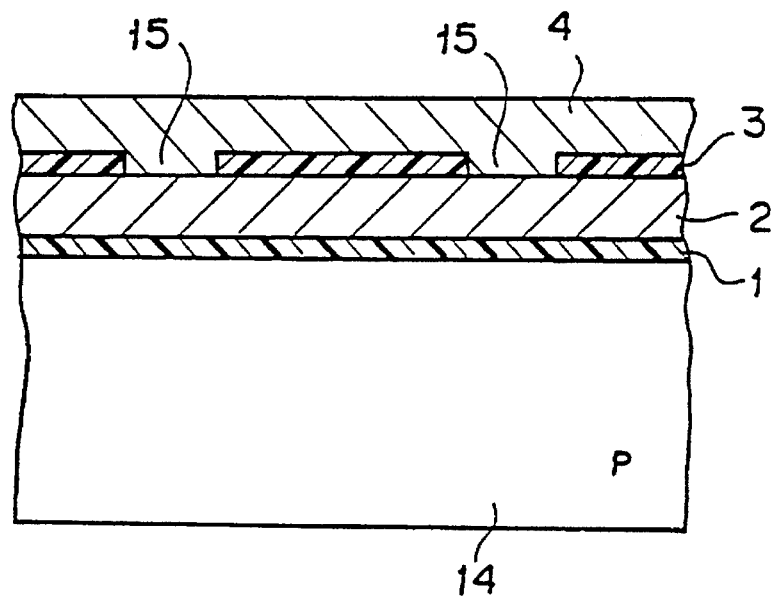
FIG. 3 a sectional view showing a wiring structure at a peripheral circuit in a solid state image sensor device of a first embodiment according to the present invention.
Figure 4:
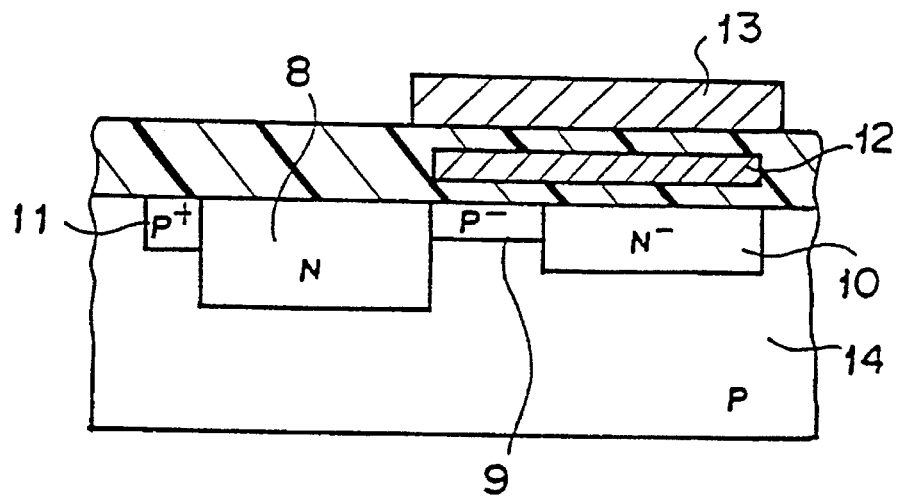
FIG. 4 is a sectional view of a unit picture element in the sold state image sensor device of the first embodiment according to the present invention.
Figure 7:
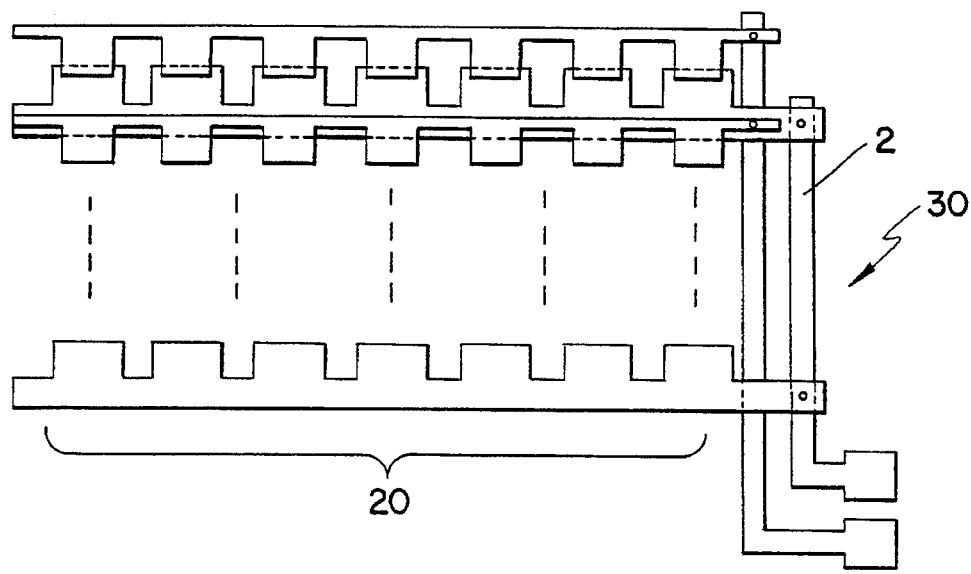
FIG. 7 is a diagrammatic plan view showing a dimensional relation between the peripheral circuit and a light receiving portion which includes a number of the picture elements.

FIG. 3 is a sectional view of the wiring of a peripheral circuit of a solid state image sensor device according to a first embodiment of the invention. The unit picture element in the light receiving portion 20 (see FIG. 7) of this embodiment shown in sectional view in FIG. 4 is the same as that in the conventional device shown in FIG. 2. Specifically, an aluminum shielding film 13 is used as a shielding film on the vertical transfer electrode 12 above the vertical register 10. A first aluminum wiring film 2 shown in FIG. 3 at the peripheral circuit 30 (see FIG. 7) is formed by the same fabrication process as that for forming the aluminum shielding film 13 at the picture element shown in FIG. 4. The dimensional relation between the peripheral circuit 30 and the light receiving portion 20 is shown in FIG. 7. Further, the first aluminum wiring film 2 is electrically in contact with a second aluminum wiring film 4 through contact holes 15 of an interlayer insulating film 3. When the second aluminum wiring film 4 is etched, It is possible to suppress to the minimum any damage to be caused by over-etching since an active region is covered by the interlayer insulating film 3. According to the wiring structure of this embodiment, the resistance of the aluminum wiring film can be reduced to about half as compared with that in the conventional device.

Figure 5:
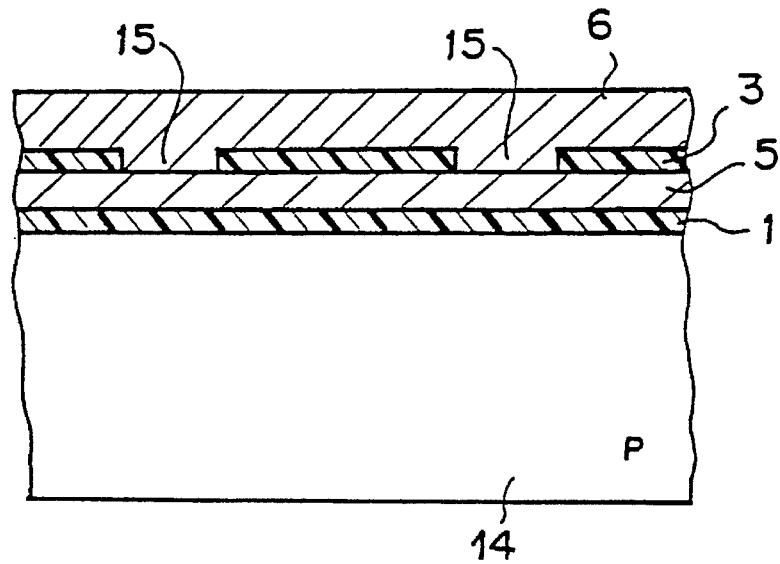
FIG. 5 sectional view showing a wiring structure at a peripheral circuit in a solid state image sensor device of a second embodiment according to the present invention.
Figure 6:
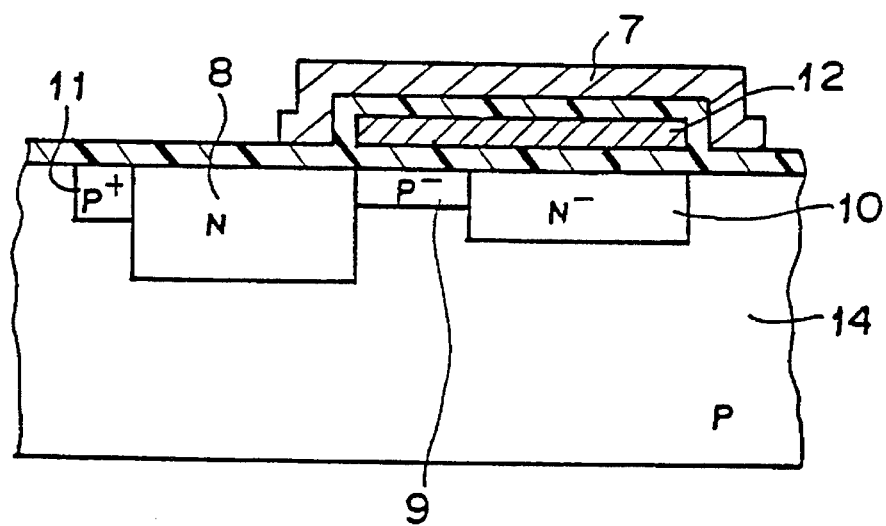
FIG. 6 is a sectional view of a unit picture element in the solid state image sensor device of the second embodiment according to the present invention.
Figure 8:
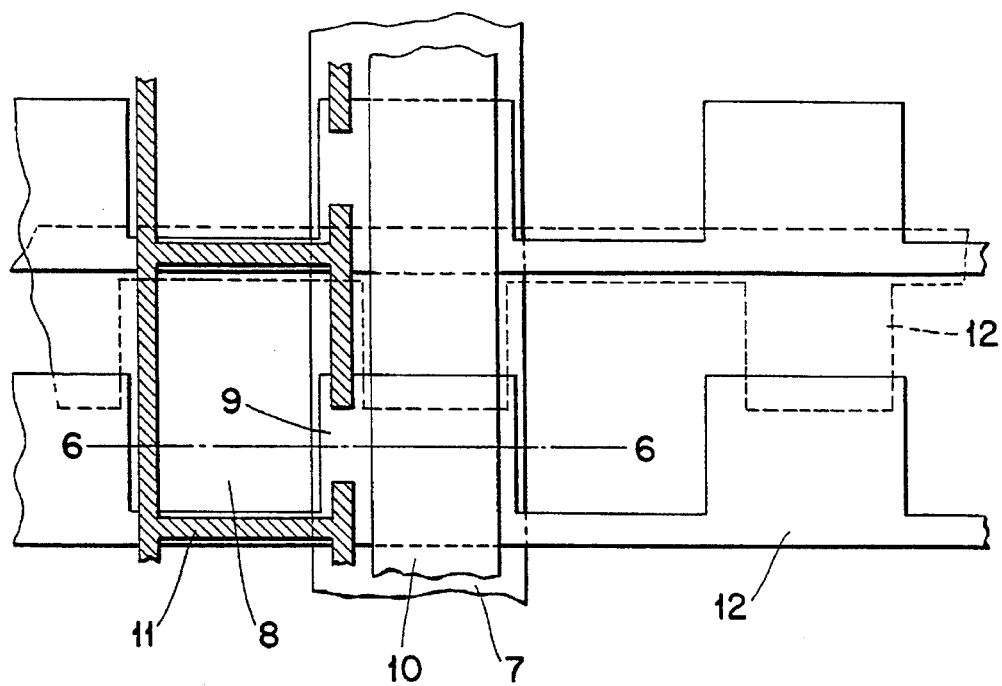
FIG. 8 is an enlarged plan view of the light receiving portion, the sectional view of FIG. 6 being taken along the line 6—6 in this figure.

Next, FIG. 5 is a sectional view showing the wiring of a peripheral circuit 30 of a solid state image sensor device according to a second embodiment of the invention. In this embodiment, after a tungsten wiring film 5 at the peripheral circuit 30 is formed, this tungsten wiring film 5 is covered by an aluminum wiring film 6. Electrical contact between the tungsten wiring film 5 and the aluminum wiring film 6 is made through the contact holes 15 in the interlayer insulating film 3. FIG. 6 shows, in sectional view taken along the line 6—6 in FIG. 8 which is an enlarged plan view of the light receiving portion 20, a unit picture element according to this embodiment, in which a tungsten shielding film 7 is used as a shielding film on the vertical transfer electrode 12 above the vertical register 10. The tungsten wiring film 5 shown in FIG. 5 at the peripheral circuit 30 (FIG. 7) and the tungsten shielding film 7 shown in FIG. 6 at the picture element in the light receiving portion 20 (FIG. 7) are formed in the same fabrication process. It is recently reported that, because of high light-shielding effect, tungsten is used as a shielding material. However, when the tungsten is used as a material for a wiring film, there are problems such that contact resistance between the tungsten film and a P-type diffusion layer is high and a bonding pad made of tungsten is poor in bonding to a metal wire, normally a gold wiring, used as a bonding wire. However, in the structure according to this embodiment, by using the aluminum wiring film 6 for establishing the contact with the P-type diffusion layer and by forming the bonding pad in aluminum, it is possible not only to lower the wiring resistance but also to solve the problems explained above.

As explained above, in the solid state image sensor device according to the invention, the wiring of the peripheral circuit is constituted by two films, namely, a first film, which is of aluminum or of a metal selected from refractory metals and which shlelds the effective light detecting element, and a second film of aluminum. Therefore, it is possible to lower the wiring resistance of the peripheral circuit and also to cause the signal transfer clock pulse of high-frequency to propagate without its waveform becoming dull.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A solid state image sensor device having an effective light detecting element and a peripheral circuit, comprising:

a light-shielding film made of metal, for shielding a periphery of said effective light detecting element;

a first wiring film made of the same material and formed in the same fabrication process as that of said light-shielding film; and a second wiring film made of aluminum forming, together with said first wiring film, a two layer wiring film for said peripheral circuit, said first and second wiring films being in electrical contact with each other.

2. A solid state image sensor device according to claim 1, in which said first wiring film is made of aluminum.

3. A solid state image sensor device according to claim 1, in which said first wiring film and said light-shielding film are made of a metal selected from refractory metals.

4. A solid state image sensor device according to claim 3, in which said metal of the first wiring film and said light-shielding film are tungsten.

5. A solid state image sensor device having a peripheral circuit and a light receiving portion which includes a number of effective light detecting elements, each of said effective light detecting elements being light-shielded at its periphery portion by a light-shielding film made of metal and electrically coupled to said peripheral circuit, said peripheral circuit comprising:

a first wiring film made of the same material as that of said light-shielding film; and a second wiring film made of aluminum which is electrically connected to said first wiring film, said second wiring film and said first wiring film forming a two layer wiring structure for said peripheral circuit.

6. A solid state image sensor device according to claim 5, in which said first wiring film is made of aluminum.

7. A solid state image sensor device according to claim 5, in which said first wiring film and said light-shielding film are made of a metal selected from refractory metals.

8. A solid state image sensor device according to claim 7, in which said metal of said first wiring film and said light-shielding film is tungsten.

9. A solid state image sensor device according to claim 5, in which said peripheral circuit further comprises an interlayer insulating film between said first wiring film and said second wiring film, said interlayer insulating film having contact holes through which electrical contact between said first wiring film and said second wiring film is made.

\* \* \* \* \*